I (12) United States Patent
Hachiya

(10) Patent No.: US 7,110,257 B2
(45) Date of Patent: Sep. 19, 2006

(54) ELECTRONIC APPARATUS INCLUDING PRINTED WIRING BOARD PROVIDED WITH HEAT GENERATING COMPONENT

(75) Inventor: Shogo Hachiya, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 10/854,767

(22) Filed: May 27, 2004

(65) Prior Publication Data

US 2004/0264114 A1 Dec. 30, 2004

(30) Foreign Application Priority Data

May 30, 2003 (JP) ............................. 2003-154249

(51) Int. Cl.
*H05K 7/20* (2006.01)
(52) U.S. Cl. .................. 361/697; 361/704; 361/719; 165/80.3; 174/16.3
(58) Field of Classification Search ................ 361/676, 361/719
See application file for complete search history.

(56) References Cited

U.S. PATENT DOCUMENTS

| 5,581,443 | A | | 12/1996 | Nakamura et al. | |
|---|---|---|---|---|---|
| 5,926,371 | A | * | 7/1999 | Dolbear | ........................ 361/704 |
| 6,285,553 | B1 | * | 9/2001 | Suyama et al. | .............. 361/719 |
| 6,442,026 | B1 | * | 8/2002 | Yamaoka | ...................... 361/704 |
| 6,549,412 | B1 | * | 4/2003 | Ma | .............................. 361/704 |
| 6,789,312 | B1 | * | 9/2004 | White | .......................... 29/832 |
| 2001/0038526 | A1 | | 11/2001 | Kajiura | |

| 2002/0112885 A1 * 8/2002 Hotta et al. .................. 174/264 |
|---|

FOREIGN PATENT DOCUMENTS

| CN | 1167934 A | 12/1997 |
|---|---|---|
| CN | 2263403 Y | 9/1999 |
| CN | 2459779 Y | 11/2001 |
| TW | 510986 | 11/2002 |

OTHER PUBLICATIONS

Thermal Analysis of a Substrate with Power Dissipation in the Vias, Robert A. Brewster and Raed A. Sherif, IEEE transactions on Components, Hybrids, and Manufacturing Technology, V15, N5, Oct. 1992, pp. 667-674.*
Test lab article for PCB Design Magazine, Lee Richey, Jan. 2000, downloaded from http://www.speedingedge.com/PDF-Files/testlab.pdf.*
Taiwanese Office Action dated Jan. 19, 2006 for Appln. No. 93113763.

(Continued)

*Primary Examiner*—Michael Datskovskiy
(74) *Attorney, Agent, or Firm*—Pillsbury Winthrop Shaw Pittman, LLP

(57) ABSTRACT

An electronic apparatus includes a housing and a printed wiring board contained in the housing. The printed wiring board includes a first surface, a second surface and a conductive layer. The first surface has a mounting area, the second surface is located opposite to the first surface in a position corresponding to the mounting area, between the first surface and the second surface. A heat generating component is mounted on the mounting area of the printed wiring board. A reinforcing member is provided on the second surface of the printed wiring board, and is in thermal contact therewith. The heat of the heat generating component is conducted to the reinforcing member through the printed wiring board, and is radiated from the reinforcing member.

4 Claims, 6 Drawing Sheets

OTHER PUBLICATIONS

Taiwanese Office Action dated Aug. 3, 2005 for Appln. No. 93113763.

Chinese Office Action dated Jun. 24, 2005 for Appln. No. 200410047264.9.

* cited by examiner

ELECTRONIC APPARATUS INCLUDING PRINTED WIRING BOARD PROVIDED WITH HEAT GENERATING COMPONENT

CROSS-REFERENCE TO RELATED APPLICATIONS

This application is based upon and claims the benefit of priority from prior Japanese Patent Application No. 2003-154249, filed May 30, 2003, the entire contents of which are incorporated herein by reference.

BACKGROUND OF THE INVENTION

1. Field of the Invention

The present invention relates to an electronic apparatus including a printed wiring board provided with heat generating components such as a power supply circuit and a CPU, and in particular a structure for radiating the heat of the heat generating components.

2. Description of the Related Art

For example, a notebook computer incorporate a CPU. The CPU and a power supply circuit for supplying power to the CPU are mounted on a printed wiring board. The power supply circuit includes a number of circuit components located in the vicinity of the CPU. The amount of heat generated by the CPU increases as the processing speed of the CPU or the number of functions thereof increases. Also, the amount of heat generated by the power supply circuit increases with an increase in the power consumption of the CPU. When the temperature of the CPU or the power supply circuit becomes too high, the CPU or circuit components cannot operate effectively. In order to solve this problem, in conventional apparatuses, a heat sink is attached to the CPU, or circuit components are separated from each other so as not to have a thermal influence on each other.

U.S. Pat. No. 5,581,443 discloses a portable computer in which a heat sink for improving the heat radiation function of the CPU is provided in a housing. The CPU includes an IC chip which generates heat, and is mounted on an upper surface of a printed wiring board. The printed wiring board has a multi-layer structure in which a number of insulating layers and conductive layers are alternately stacked on one another. Also, the printed wiring board has a through hole formed in association with the position of the IC chip. The through hole is larger than the IC chip, and extends through the printed wiring board in the thickness direction thereof.

The heat sink is fixed to the printed wiring board, and comprises a main body and a cover. The main body is located on a lower surface of the printed wiring board. The cover is located on the upper surface of the printed wiring board. To be more specific, the main body has a convex portion at its center portion. The convex portion extends through the through hole, and its distal end surface is in thermal contact with the IC chip. The cover is in thermal contact with the IC chip through a heat-transmitting sheet. The main body and the cover are fixed to the printed wiring board by screws, as a result of which the IC chip is held between the main body and the cover.

When heat is generated from the IC chip, it is transmitted to the main body and cover of the heat sink. Thus, the heat of the IC chip is radiated into the housing through the main body and the cover.

In the above U.S. patent, the through hole through which the concave portion extends must be formed in the printed wiring board, in order that the main body of the heat sink be in thermal contact with the IC chip. Therefore, a specific step of forming the through hole in the printed wiring board must be added, thus increasing the number of steps for manufacturing the printed wiring board. Inevitably, the manufacturing cost of the printed wiring board is increased.

Furthermore, in the printed wiring board having a multi-layer structure in which insulating layers and conductive layers are alternately stacked on one another, the conductive layers must be formed to bypass the through hole. Inevitably, the wiring lengths of the conductive layers are increased. This is not desirable, especially for a high-speed circuit in which signals are transmitted at high speed.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, server to explain the principles of the invention.

DETAILED DESCRIPTION OF THE INVENTION

The first embodiment of the present invention will be explained with reference to FIGS. 1–5 showing a portable computer to which the first embodiment is applied.

Figure 1:
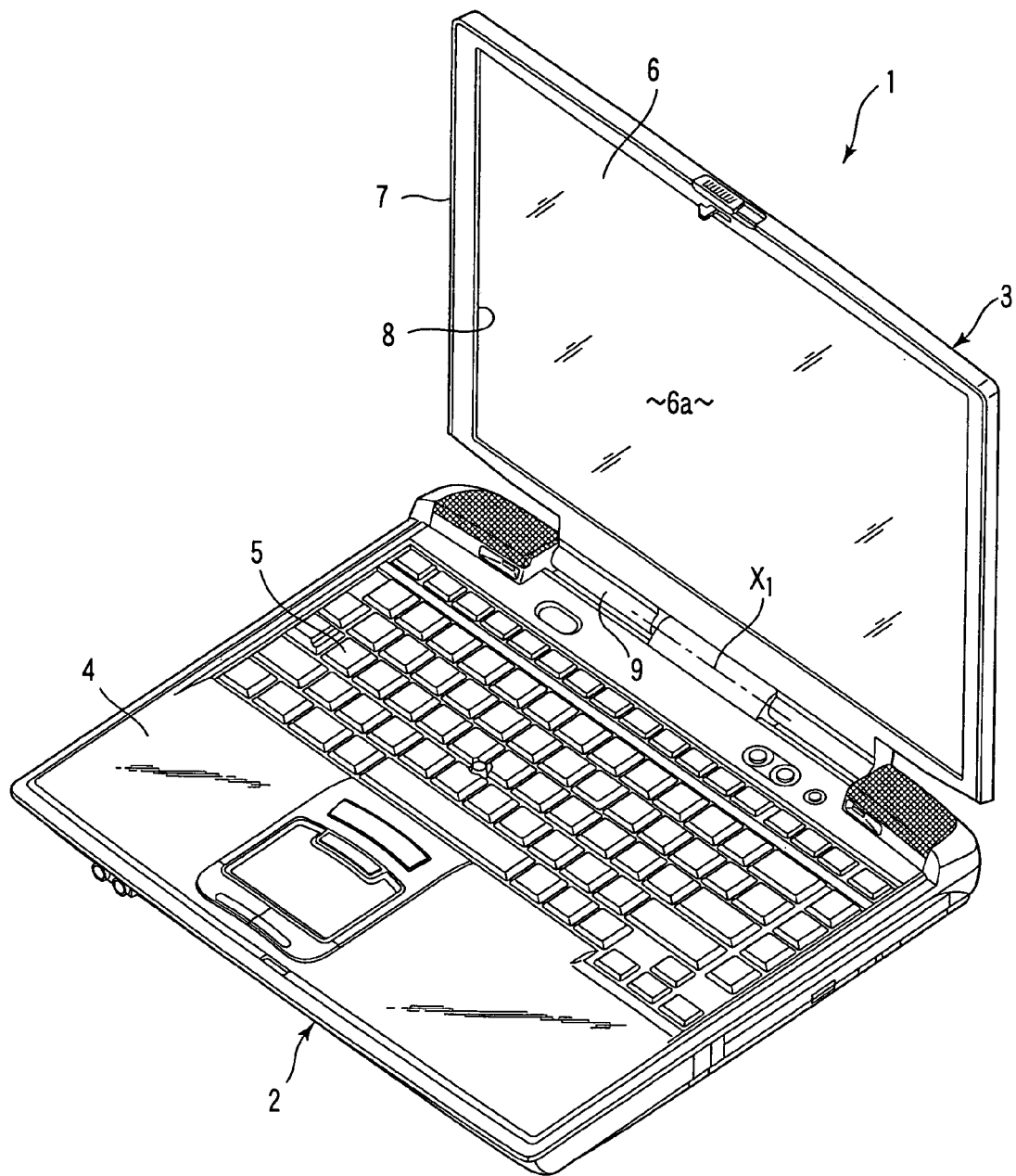
FIG. 1 is a perspective view of a portable computer according to the first embodiment of the present invention.
Figure 2:
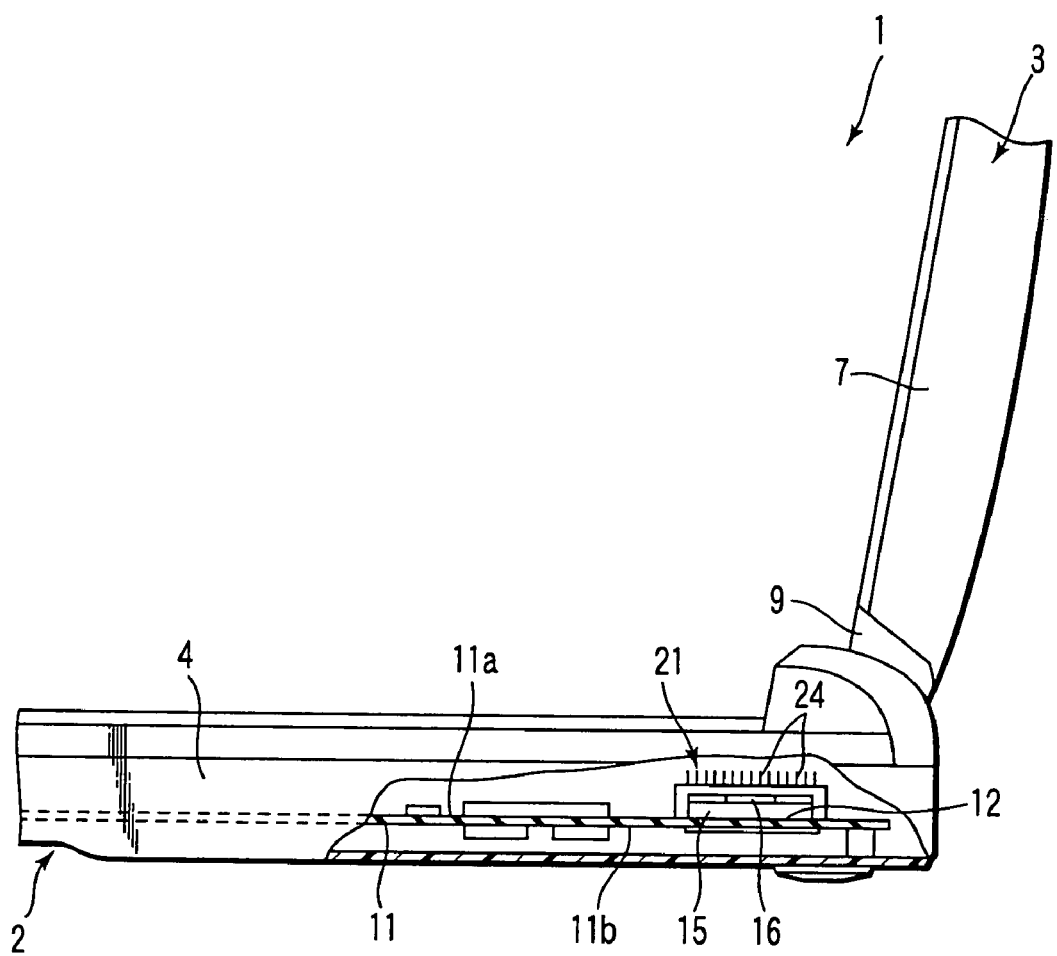
FIG. 2 is a side view of the portable computer, which shows a partial vertical section of a printed wiring board which is contained in a housing.

FIGS. 1 and 2 disclose a potable computer 1 as an electronic apparatus. The portable computer 1 comprises a main unit 2 and a display unit 3. The main unit 2 includes a first housing 4 which is thin and box-shaped. The first housing 4 supports a keyboard 5.

The display unit 3 comprises a liquid crystal display panel 6 and a second housing 7. The liquid crystal display panel 6 includes a screen 6a for displaying an image. The second housing 7 is thin and box-shaped, and holds therein the liquid crystal display panel 6. The second housing 7 includes a rectangular opening 8 at its front surface. The screen 6a of the liquid crystal panel 6 is exposed through the opening 8.

The second housing 7 includes a leg portion 9 at its one end. The leg portion 9 is coupled to a rear end portion of the first housing 4 by a hinge (not shown). The hinge has an axis X1 which horizontally extends along the width direction of the first housing 4. The display unit 3 is rotatable around the axis X1 of the hinge, between a closed position and an open position. In the closed position, the display unit 3 lies on the main unit 2 to cover the keyboard 5 from above. In the open position, the display unit 3 is upright with respect to the main unit 2, and the keyboard 5 and the screen 6a are exposed.

Figure 3:
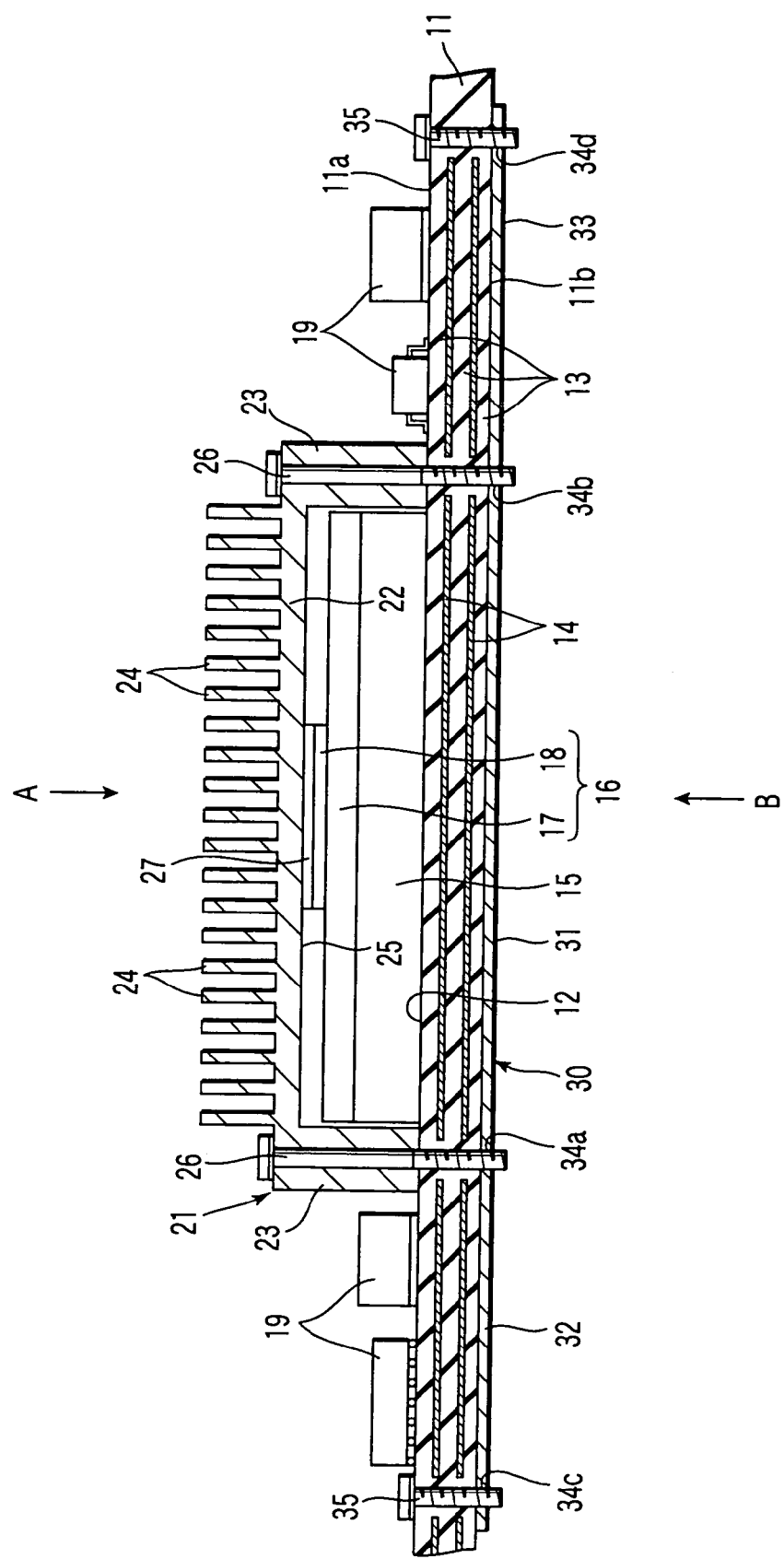
FIG. 3 is a vertical section of the printed wiring board, and shows that a CPU, a heat sink and a reinforcing plate are provided at the printed wiring board.

The first housing 4 contains a printed wiring board 11. As shown in FIGS. 2 and 3, the printed wiring board 11 includes a first surface 11a and a second surface 11b located opposite to the first surface 11a. At a rear portion of the first surface 11a, a rectangular socket mounting area 12 is provided.

The printed wiring board 11 has a multi-layer structure in which insulating layers 13 and conductive layers 14 are alternately stacked on one another. Each of the conductive layers 14 includes a signal layer, a power supply layer and a ground layer. The ground layer is formed rectangularly within the printed wiring board 11. The conductive layers 14 are interposed between the first surface 11a and second surface 11b of the printed wiring board 11, and are located under the socket mounting area 12.

As shown in FIG. 3, a CPU socket 15 is soldered to the socket mounting area 12 of the printed wiring board 11. The CPU socket 15 supports a CPU 16 which is also a first heat generating component, such that the CPU 16 is detached from the CPU socket 15. The CPU 16 comprises a base substrate 17 including a number of pin terminals, and a IC chip 18 mounted on a center portion of the base substrate 17. The IC chip 18 is designed to operate at a higher speed and to be multifunctional, as a result of which its heat output during operation is very large. Thus, the IC chip 18 needs to be cooled to maintain stable operation.

A number of circuit components 19 such as a transistor, a capacitor, a coil and a resistance are mounted on the first surface 11a of the printed wiring board 11. The circuit components 19 form a power supply circuit for supplying power to the CPU 16 in cooperation with the printed wiring board 11. The circuit components 19 are located in the vicinity of the CPU 16. The heating values of the circuit components 19 are increased to be considerably great, in accordance with increasing of the power consumption of the CPU 16. Thus, the circuit components 19 need to be cooled in order to maintain stable operation. Therefore, in the first embodiment, each of the circuit components 19 is a second heat generating component.

Figure 4:
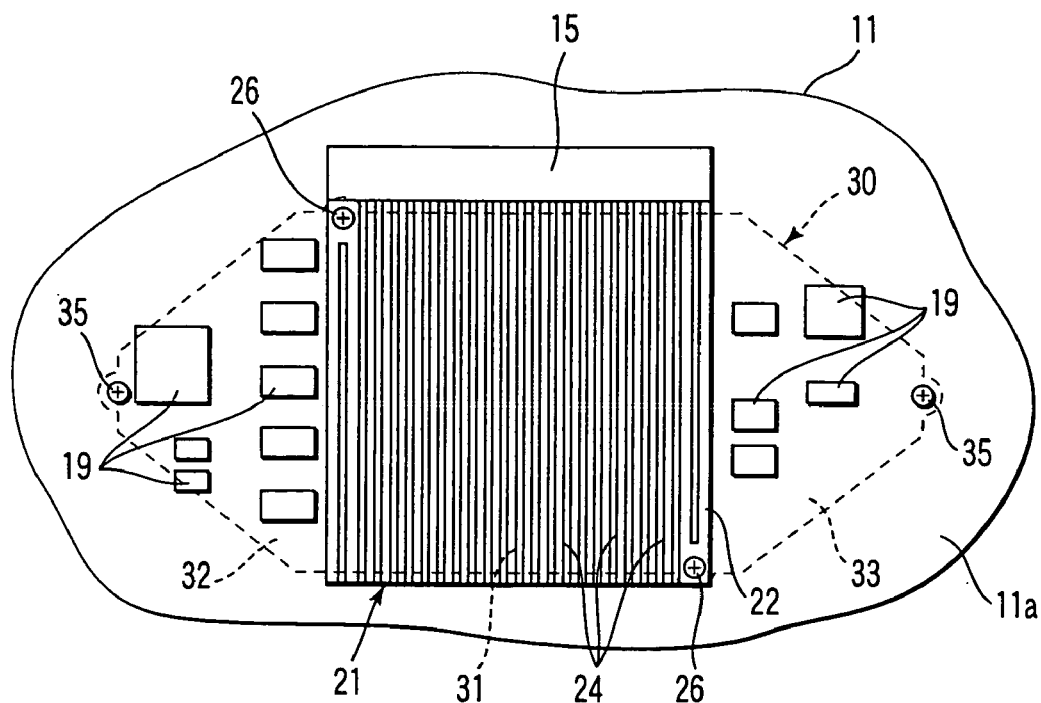
FIG. 4 is a plan view of the printed wiring board as viewed in direction A in FIG. 3.

As shown in FIGS. 3 and 4, a heat sink 21 made of metal is attached to the first surface 11a of the printed wiring board 11. The heat sink 21 comprises a main body 22 having four corner portions and leg portions 23 respectively located at the corner portions. The main body 22 is formed in the shape of a square plate, and is larger than the size of the CPU 16. Also, the main body 22 includes a number of radiating fins 24 at its upper surface. The radiating fins 24 are formed integral with the main body 22. A lower surface of the main body 22 serves as a flat heat receiving surface 25. The heat receiving surface 25 is larger than the CPU 16, and completely covers the CPU 16 from above.

The four leg portions 23 extend downwards to a level lower than the heat receiving surface 25. End surfaces of the leg portions 23 contact the first surface 11a of the printed wiring board 11. Of the four leg portions 23, two diametrically-opposed leg portions 23 on the main body 22 are fixed to the printed wiring board 11 by screws 26. The screws 26 penetrate the insulating layers 13 on the printed wiring board 11. The conductive layers 14 are provided on the printed wiring board 11 in such a manner as to avoid regions to be penetrated by the screws 26. The distal ends of the screws 26 project from the second surfaces 11b of the printed wiring board 11.

When the heat sink 21 is fixed to the first surface 11a of the printed wiring board 11, the heat receiving surface 25 of the heat sink 21 covers the IC chip 18 of the CPU 16 from above. A gap between the IC chip 18 and the heat receiving surface 25 is filled with grease 27 having a high thermal conductivity. Thus, the heat receiving surface 25 of the heat sink 21 is in thermal contact with the IC chip 18 through the grease 27.

The first housing 4 contains an electric fan. The electric fan operates when the temperature of the CPU 16 reaches a predetermined value, and supplies a cooling air to the heat sink 21.

Figure 5:
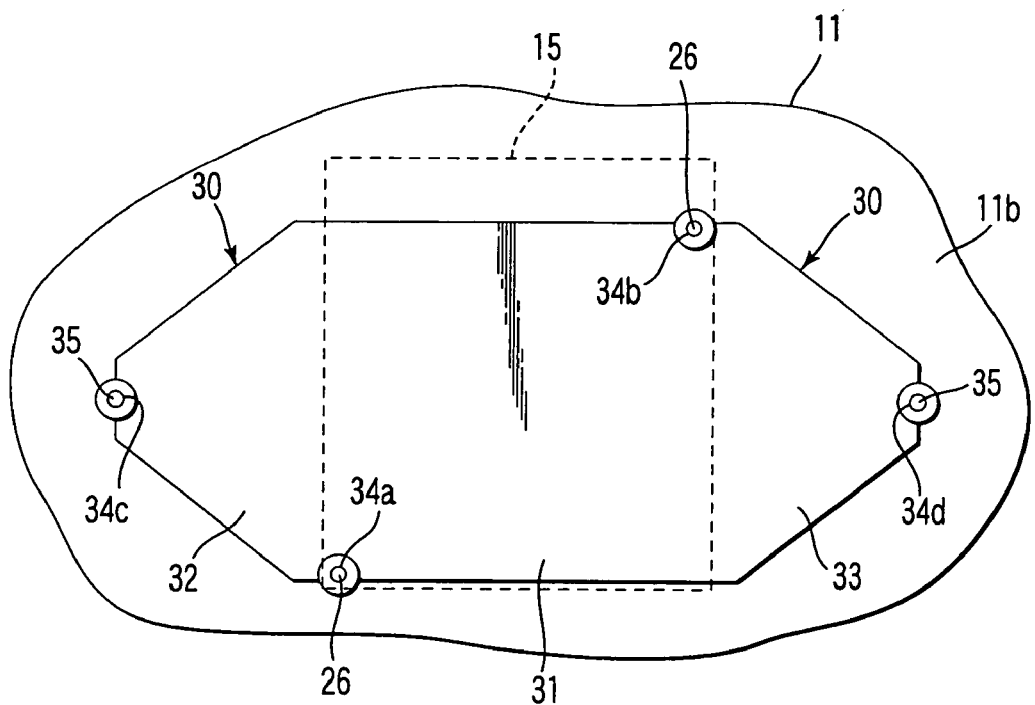
FIG. 5 is a rear view of the printed wiring board as viewed in direction B in FIG. 3.

As shown in FIGS. 3 and 5, a reinforcing plate 30 as a reinforcing member is provided on the second surface 11b of the printed wiring board 11. The reinforcing plate 30 is formed of a metal plate subjected to, e.g., a sheet metal working. The reinforcing plate 30 reinforces portions of the heating sink 21 and the printed wiring board 11 which are fixed to each other, in a direction toward the above fixed portions from the second surface 11b of the printed wiring board 11, thereby restricting a warp or deformation of the printed wiring board 11. In other words, the reinforcing plate 30 is located opposite to the heat sink 21 with respect to the printed wiring board 11, and also overlaps the second surface 11b of the printed wiring board 11.

The reinforcing plate 30 includes a center portion 31, a first end portion 32 and a second end portion 33. The center portion 31 having a size corresponding to that of the heat sink 21. The first end portion 32 extending from one end of the center portion 31. The second end portion 33 extending from the other end of the center portion 31. The center portion 31 is located opposite to the CPU socket 15 with respect to the printed wiring board 11. The first end portion 32 and the second end portion 33 are located opposite to the circuit components 19 with respect to the printed wiring board 11.

As shown in FIGS. 3 and 5, the reinforcing plate 30 further includes first to fourth screw holes 34a, 34b, 34c and 34d. The first and second screw holes 34a and 34b are formed in diametrically-opposed positions of the center portion 31. The third screw hole 34c is formed in a distal end of the first end portion 32. The fourth screw hole 34d is formed in a distal end of the second end portion 33.

The screws 26 penetrating the leg portions 23 of the heat sink 21 are screwed into the first and second screw holes 34a and 34b, respectively. Also, screws 35 screw into the third and fourth screw holes 34c and 34d in the first and second end portions 32 and 33. The screws 35 penetrate the insulating layer 13 in the printed wiring board 11 in positions located apart from the socket mounting area 12.

Consequently, the center portion 31 of the reinforcing plate 30 is fixed along with the heat sink 21 to the printed wiring board 11. Furthermore, the first and second end portions 32 and 33 of the reinforcing plate 30 are fixed to the printed wiring board 11 by the screws 35. Due to this, the reinforcing plate 30 tightly contacts the second surface 11b of the printed wiring board 11, and is also in thermal contact with the second surface 11b.

The IC chip 18 in the CPU 16 generates heat during operation of the portable computer 1. Much of the heat from the IC chip 18 is conducted to the heat receiving surface 25 of the heat sink 21 through the grease 27, and diffuses into the main body 21 of the heat sink 21. The heat diffusing into the main body 22 is radiated into the first housing 4 from the surface of the radiating fins 24.

At such a temperature as to operate the electric fan, cooling air sent from the electric fan flows between the radiating fins 24. As a result, the heat of the IC chip 18 which is conducted to the radiating fins 24 is dissipated by the cooling air, thus achieving heat exchange between the radiating fins 24 and the cooling air.

The circuit components 19 forming the power supply circuit are mounted on the first surface 11a of the printed wiring board 11. The heat of the circuit components 19 is conducted from the first surface 11a to the printed wiring board 11. Consequently, the temperature of, especially, the part of the second surface 11b of the printed wiring board 11, which corresponds to the circuit components 19, increases.

The reinforcing plate 30 reinforcing the fixed portions of the printed wiring board 11 and heat sink 21 overlaps the second surface 11b of the printed wiring board 11. The heat conducted from the IC chip 18 to the printed wiring board 11 is also conducted from the second surface 11b to the reinforcing plate 30, and then is radiated from the surface of the reinforcing plate 30 into the first housing 4. Thus, the reinforcing plate 30 doubles a heat radiating member for radiating the heat of the circuit components 19.

By virtue of the above structure, the heat of the circuit components 19 can be radiated by utilizing the reinforcing plate 30 reinforcing the fixed portions of the printed wiring board 11 and heat sink 21. The heat of the circuit components 19 is conducted to the reinforcing plate 30 through the printed wiring board 11. Therefore, it is not necessary to form a hole for radiation in the printed wiring board 11, unlike conventional apparatuses. Thus, the number of steps for manufacturing the printed wiring board 11 is not increased, and the manufacturing cost of the printed wiring board 11 is prevented from being increased.

In addition, in the printed wiring board 11, the conductive layers 14 can be provided just under the CPU 16 and the circuit components 19, since it is not necessary to form holes in portions of the printed wiring board 11 which correspond to the CPU 16 and the circuit components 19. Accordingly, a pattern of the conductive layers 14 can be easily designed. In addition, the wiring lengths of the conductive layers 14 can be shortened. This is desirable, especially for a high speed circuit handing signals which are transmitted at high speed.

Furthermore, in the first embodiment, the reinforcing plate 30 is a component subjected to a sheet metal working, and is suitable for mass production. Therefore, the total cost of parts can be lowered.

Figure 6:
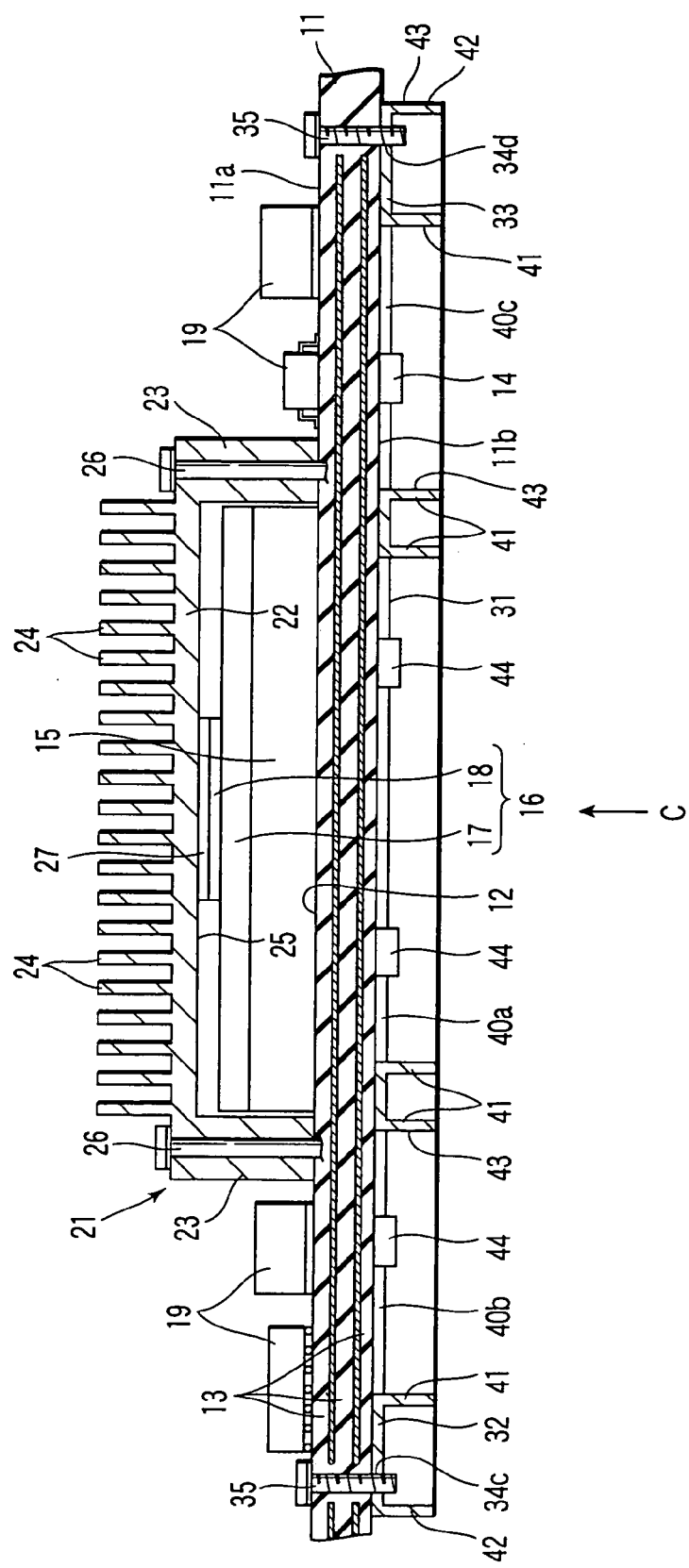
FIG. 6 is a vertical section of a printed wiring board according to the second embodiment of the present invention, and shows that a CPU, a heat sink and a reinforcing plate are provided at the printed wiring board.
Figure 7:
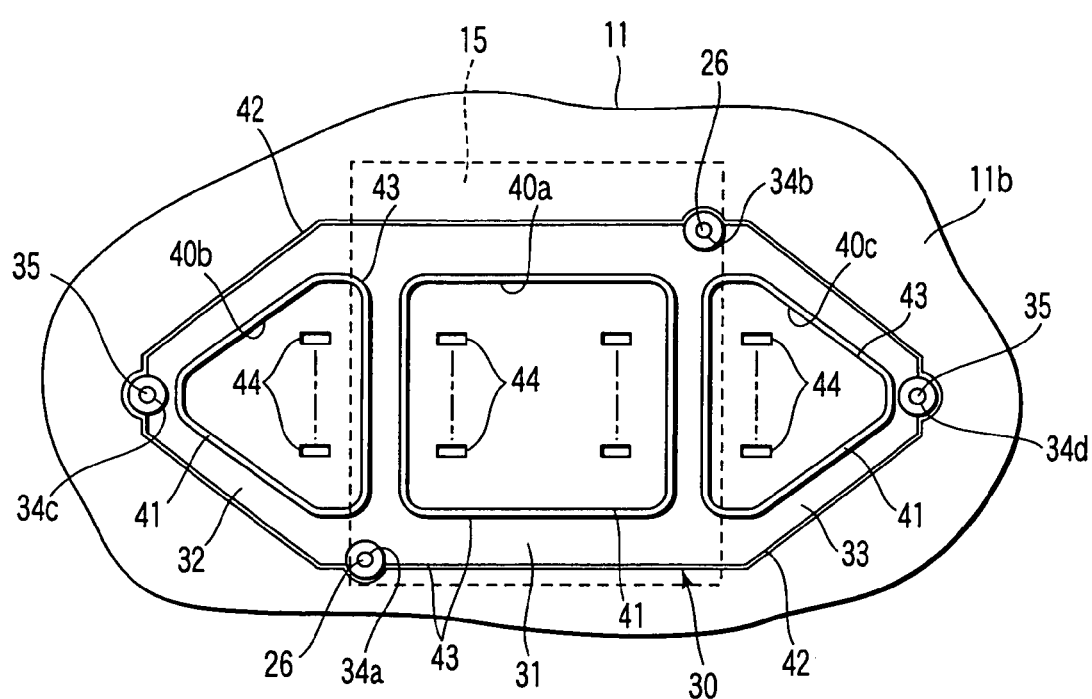
FIG. 7 is a rear view of the printed wiring board as viewed in direction C in FIG. 6.

The present invention is not limited to the above first embodiment. FIGS. 6 and 7 show the second embodiment of the present invention. The structure of the reinforcing plate 30 applied in the second embodiment is different from that of the reinforcing plate 30 in the first embodiment. The other structure of the portable computer 1 according to the second embodiment is the same as that of the portable computer 1 according to the first embodiment. Therefore, with respect to the second embodiment, the same structural elements as in the first embodiment are respectively denoted by the same reference numerals as in the first embodiment, and their explanations will be omitted.

As shown in FIGS. 6 and 7, in the second embodiment, the reinforcing plate 30 includes first to third opening portions 40a, 40b and 40c. The first opening portion 40a is located at the center portion 31 of the reinforcing plate 30. The second opening portion 40b is located at the first end portion 32 of the reinforcing plate 30. The third opening portion 40c is located at the second end portion 33 of the reinforcing plate 30. Provision of the first to third opening portions 40a, 40b and 40c is intended to reduce the weight of the reinforcing plate 30. These opening portions are punched together when the reinforcing plate 30 is subjected to a sheet metal working.

First extension portions 41 are provided at opening edges of the first to third opening portions 40a, 40b and 40c, respectively. The first extension portions 41 are formed together when the reinforcing plate 30 is subjected to the sheet metal working, and are each formed in the shape of a flange in such a manner as to project in a direction away from the printed wiring board 11. Each of the first extension portions 41 continuously extends along the periphery of an associated one of the first to third opening portions 40a, 40b and 40c. Further, a second extension portion 42 is formed at an outer peripheral edge of the reinforcing plate 30. The second extension portion 42 is formed when the reinforcing plate 30 is subjected to the sheet metal working, and is also formed in the shape of a flange in a direction away from the printed wiring board 11. The second extension portion 42 continuously extends along the periphery of the reinforcing plate 30.

As shown in FIG. 6, the first and second extension portions 41 and 42 of the reinforcing plate 30 are upright with respect to the second surface 11b of the printed wiring board 11. Thus, the first and second extension portions 41 and 42 double as radiating fins 43.

Furthermore, the first to third opening portions 40a, 40b and 40c of the reinforcing plate 30 are open in the second surface 11b of the printed wiring board 11. In the second embodiment, a number of chip components 44 are mounted on areas of the second surface 11b of the printed wiring board 11, which correspond to the first to third opening portions 40a, 40b and 40c.

By virtue of the above structure, the first extension portions 41 projecting from the opening edges of the first to third opening portions 40a, 40b and 40c and the second extension portion 42 projecting from the outer peripheral edge of the reinforcing plate 30 also serve as the radiating fins 43. Thus, the contact area between the reinforcing plate 30 and air increases, thereby efficiently radiating the heat of the circuit components 19 which is conducted to the reinforcing plate 30.

Moreover, since the first to third opening portions 40a, 40b and 40c are formed in the reinforcing plate 30, the chip components 44 can be mounted on the areas of the printed wiring board 11, which correspond to the opening portions 40a, 40b and 40c. Thus, in spite of provision of the reinforcing plate 30 on the second surface 11b, the second surface 11 can ensure an area for mounting components, as a result of which components can be mounted at a higher density.

The present invention is not limited to the first embodiment or the second embodiment, and can be various modified without departing from the subject matter of the present invention. For example, in the case where a ground layer is stacked together within the printed wiring board, the following structure may be provided: pads are provided on the second surface of the printed wiring board such that they are electrically connected to the ground layer, and the reinforcing plate contacts the pads. By virtue of this structure, the heat of the circuit components can escape from the pads to the ground layer, thereby improving the heat radiation function of the circuit components.

Furthermore, conduction of heat from the pads to the ground layer can be efficiently effected by increasing the areas of the pads as much as possible to ensure a sufficient contact area between the pads and the reinforcing plate.

In addition, the heat generating component is not limited to the CPU. The present invention may be applied to a computer in which a chip set is regarded as the heat generating component. Also, the reinforcing plate is not limited to a metal plate subjected to a sheet metal working. It may be a casting containing, e.g., an aluminum alloy.

Additional advantages and modifications will readily occur to those skill in the art. Therefore, the invention in its broader aspects is not limited to the specific details and representative embodiments shown and described herein. Accordingly, various modifications may be made without departing from the sprit or scope of the general inventive concept as defined by the appended claims and their equivalents.

What is claimed is:

1. An electronic apparatus comprising:
    a printed wiring board which comprises a first surface including a mounting area, a second surface located opposite to the first surface;
    a heat generating component mounted on the mounting area of the printed wiring board;
    a heat sink attached to the first surface of the printed wiring board, the heat sink being in thermal contact with the heat generating component;
    a metal reinforcing member overlaps the second surface of the printed wiring board, the metal reinforcing member reinforcing portions of the printed wiring board and the heat sink which are fixed to each other, and the metal reinforcing member being thermal contact with the printed wiring board, the metal reinforcing member includes an opening portion, a first extension portion formed at an opening edge of the opening portion, and a second extension portion formed at an outer peripheral edge of the metal reinforcing plate, the first and second extension portions project in a direction away from the printed wiring board so that they function as radiating fins, which stand upright on the second surface of the printed wiring board; and
    a housing containing the printed wiring board, the heat generating component, the heat sink and the metal reinforcing member.

2. The electronic apparatus according to claim 1, wherein the metal reinforcing member is greater in size than the heat sink.

3. The electronic apparatus according to claim 1, wherein the printed wiring board includes a conductive layer and an insulating layer, the conductive layer is located between the first and second surfaces in a position corresponding to the mounting area, the insulating layer is stacked on the conductive layer, and the metal reinforcing member is fixed to the insulating layer by screws.

4. The electronic apparatus according to claim 1, wherein the printed wiring board includes a plurality of insulating layers and a plurality of conductive layers, the insulating and conductive layers are alternately stacked on one another in a thickness direction of the printed wiring board, and the conductive layers are located in positions corresponding to the heat generating component, between the first surface and the second surface of the printed wiring board.

* * * * *